(12) United States Patent 　　　　(10) Patent No.: US 12,574,011 B2

Xu et al. 　　　　(45) Date of Patent: Mar. 10, 2026

(54) BULK ACOUSTIC WAVE FILTER WITH SECOND HARMONIC SUPPRESSION

(71) Applicant: Skyworks Solutions, Inc., Irvine, CA (US)

(72) Inventors: Zhaogeng Xu, Cambridge (CA); Li Chen, Irvine, CA (US); Yiliu Wang, Irvine, CA (US)

( * ) Notice: Subject to any disclaimer, the term of this patent is extended or adjusted under 35 U.S.C. 154(b) by 93 days.

(21) Appl. No.: 18/511,811

(22) Filed: Nov. 16, 2023

(65) Prior Publication Data

US 2024/0178816 A1 　　May 30, 2024

Related U.S. Application Data

(60) Provisional application No. 63/385,163, filed on Nov. 28, 2022, provisional application No. 63/385,177, filed on Nov. 28, 2022, provisional application No. 63/385,156, filed on Nov. 28, 2022.

(51) Int. Cl.
| | |
|---|---|
| *H03H 9/54* | (2006.01) |
| *H03H 9/02* | (2006.01) |
| *H03H 9/13* | (2006.01) |
| *H03H 9/205* | (2006.01) |
| *H03H 9/56* | (2006.01) |
| *H03H 9/60* | (2006.01) |
| *H03H 9/70* | (2006.01) |

(52) U.S. Cl.
CPC ........ *H03H 9/542* (2013.01); *H03H 9/02015* (2013.01); *H03H 9/02125* (2013.01); *H03H 9/133* (2013.01); *H03H 9/205* (2013.01); *H03H 9/568* (2013.01); *H03H 9/60* (2013.01); *H03H 9/706* (2013.01)

(58) Field of Classification Search
None
See application file for complete search history.

(56) References Cited

U.S. PATENT DOCUMENTS

| | | | |
|---|---|---|---|
| 4,575,690 A | 3/1986 | Walls et al. | |
| 5,351,021 A | 9/1994 | Masaie et al. | |
| 6,747,530 B1 | 6/2004 | Selmeier | |
| 7,339,445 B2 | 3/2008 | Aigner et al. | |
| 7,515,018 B2 | 4/2009 | Handtmann et al. | |
| 7,548,140 B2 | 6/2009 | Jamneala et al. | |
| 9,577,606 B2 | 2/2017 | Link et al. | |
| 10,396,759 B2 * | 8/2019 | Irieda ..................... | H03H 9/564 |

(Continued)

*Primary Examiner* — Wilson Lee

(74) *Attorney, Agent, or Firm* — Knobbe, Martens, Olson & Bear, LLP

(57) ABSTRACT

Aspects of this disclosure relate to acoustic wave filters with second harmonic emission suppression. In an embodiment, an acoustic wave filter includes a first pair of bulk acoustic wave resonators in anti-series with each other and a second pair of bulk acoustic wave resonators in anti-series with each other. The second pair of bulk acoustic wave resonators has reverse electrode polarization relative to the first pair of bulk acoustic wave resonators. The first pair of bulk acoustic wave resonators is in series with the second pair of bulk acoustic wave resonators. Other embodiments of acoustic wave filters with second harmonic emission suppression are disclosed. Related multiplexers, radio frequency modules, wireless communication devices, and methods are disclosed.

20 Claims, 16 Drawing Sheets

(56)  References Cited

U.S. PATENT DOCUMENTS

| | | | |
|---|---|---|---|
| 11,405,013 B2 * | 8/2022 | Shin | H03H 9/605 |
| 11,522,513 B2 * | 12/2022 | Shin | H04B 1/0057 |
| 2008/0007369 A1 | 1/2008 | Barber et al. | |
| 2008/0136555 A1 | 6/2008 | Schmidhammer | |
| 2016/0191015 A1 * | 6/2016 | Ivira | H03H 9/02118 |
| | | | 333/190 |
| 2018/0123555 A1 | 5/2018 | Lee | |
| 2019/0273521 A1 | 9/2019 | Nishikawa | |
| 2020/0274520 A1 | 8/2020 | Shin et al. | |
| 2021/0126625 A1 | 4/2021 | Wang et al. | |
| 2024/0178811 A1 | 5/2024 | Xu et al. | |
| 2024/0178815 A1 | 5/2024 | Xu et al. | |

* cited by examiner

QUAD SPLIT

SHUNT SPLIT

SERIES SPLIT

160

RF_IN

RF_OUT

BULK ACOUSTIC WAVE FILTER WITH SECOND HARMONIC SUPPRESSION

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/385,156, filed Nov. 28, 2022 and titled "ACOUSTIC WAVE FILTER WITH SECOND HARMONIC EMISSION SUPPRESSION," U.S. Provisional Application No. 63/385,163, filed Nov. 28, 2022 and titled "BULK ACOUSTIC WAVE FILTER WITH SECOND HARMONIC SUPPRESSION," and U.S. Provisional Application No. 63/385,177, filed Nov. 28, 2022 and titled "BULK ACOUSTIC WAVE FILTER FOR SECOND HARMONIC RESIDUE REDUCTION," the disclosures of each of which are hereby incorporated by reference in their entireties and for all purposes.

BACKGROUND

Technical Field

The disclosed technology relates to acoustic wave devices. Embodiments disclosed herein relate to bulk acoustic wave filters with harmonic suppression.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of acoustic resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

BAW resonators can have non-linearities at high power levels. For example, BAW resonators can generate second harmonic power emissions (H2) when filtering signals at high power levels. Reducing and/or eliminating H2 is generally desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter with second harmonic emission suppression. The acoustic wave filter includes a first pair of bulk acoustic wave resonators in anti-series with each other, a second pair of bulk acoustic wave resonators in anti-series with each other, and a capacitor. The first pair of bulk acoustic wave resonators includes a first bulk acoustic wave resonator and a second bulk acoustic wave resonator. The second pair of bulk acoustic wave resonators is in parallel with the first pair of bulk acoustic wave resonators. The second pair of bulk acoustic wave resonators has reverse electrode polarization relative to the first pair of bulk acoustic wave resonators. The capacitor is connected to a common electrode of the first bulk acoustic wave resonator and the second bulk acoustic wave resonator. The capacitor is configured to compensate for a mismatch in parasitic capacitance between the first pair of bulk acoustic wave resonators and the second pair of bulk acoustic wave resonators. The acoustic wave filter is configured to filter a radio frequency signal.

The acoustic wave filter can include a plurality of additional acoustic wave resonators. All other acoustic wave resonators of the acoustic wave filter can be coupled to an antenna node by way of the first and second pairs of bulk acoustic wave resonators. The plurality of additional acoustic wave resonators can include a pair of shunt resonators in anti-parallel with each other in a filter stage. The plurality of additional acoustic wave resonators can include a pair of series bulk acoustic wave resonators in anti-series with each other in a filter stage. The acoustic wave filter can include a second capacitor connected to a common electrode of the pair of series bulk acoustic wave resonators. The plurality of additional acoustic wave resonators can be bulk acoustic wave resonators.

The first and second bulk acoustic wave resonators can be series bulk acoustic wave resonators.

The acoustic wave filter can be a transmit filter.

The acoustic wave filter can be included in a multiplexer that includes at least one additional acoustic wave filter connected to the acoustic wave filter at a common node.

The capacitor can have a capacitance in a range from 0.03 picofarad to 0.2 picofarad. The capacitor can be an inter-digital transducer electrode capacitor. The capacitor can be a resonator capacitor. The capacitor can be a near metal capacitor. The capacitor can be a metal insulator metal capacitor.

The acoustic wave filter can include a pair of shunt bulk acoustic wave resonators in anti-series with each other and a second capacitor connected to a common electrode of the pair of shunt bulk acoustic wave resonators.

Another aspect of this disclosure is a radio frequency module that includes an acoustic wave filter, radio frequency circuitry coupled to the acoustic wave filter, and a package structure enclosing the acoustic wave filter and the radio frequency circuitry. The acoustic wave filter includes a first pair of bulk acoustic wave resonators in anti-series with each other, a second pair of bulk acoustic wave resonators in anti-series with each other and having reverse electrode polarization relative to the first pair of bulk acoustic wave resonators, and a capacitor connected to a common electrode of a first bulk acoustic wave resonator and a second bulk acoustic wave resonator of the first pair of bulk acoustic wave resonators, The radio frequency circuitry can include a switch and/or a power amplifier.

The acoustic wave filter is included in a multiplexer. The multiplexer can include a second filter connected to the acoustic wave filter at a common node.

Another aspect of this disclosure is method of radio frequency signal processing with second harmonic emission suppression. The method includes amplifying a radio frequency signal and filtering the radio frequency signal with an acoustic wave filter. The acoustic wave filter includes a first pair of bulk acoustic wave resonators in anti-series with each other, a second pair of bulk acoustic wave resonators in anti-series with each other and having reverse electrode polarization relative to the first pair of bulk acoustic wave resonators, and a capacitor connected to a common electrode of a first bulk acoustic wave resonator and a second bulk acoustic wave resonator of the first pair of bulk acoustic wave resonators, the capacitor compensating for a mismatch in parasitic capacitance between the first pair of bulk acoustic wave resonators and the second pair of bulk acoustic wave resonators to provide second harmonic emission suppression.

Another aspect of this disclosure is an acoustic wave filter with second harmonic emission suppression. The acoustic wave filter includes a first pair of bulk acoustic wave resonators in anti-series with each other in a filter stage and a second pair of bulk acoustic wave resonators in anti-series with each other in another filter stage. The second pair of bulk acoustic wave resonators have reverse electrode polarization relative to the first pair of bulk acoustic wave resonators. The first pair of bulk acoustic wave resonators is series with the second pair of bulk acoustic wave resonators. The acoustic wave filter is configured to filter a radio frequency signal.

The acoustic wave filter can include comprising a capacitor connected to a common electrode of the first pair of bulk acoustic wave resonators. The capacitor can cause second harmonic emissions to be reduced. The capacitor can have a capacitance in a range from 0.03 picofarad to 0.2 picofarad. The acoustic wave filter can include a second capacitor connected to a common electrode of the second pair of bulk acoustic wave resonators.

The acoustic wave filter can include a third pair of bulk acoustic wave resonators in anti-series with each other. The first pair of bulk acoustic wave resonators can be in series with the third pair of bulk acoustic wave resonators. The first pair of bulk acoustic wave resonators and the third pair of bulk acoustic wave resonators can have a common electrode polarization.

The acoustic wave filter can include a pair of shunt bulk acoustic wave resonators in anti-parallel with each other in a shunt filter stage. The acoustic wave filter can include an inductor in series with one shunt bulk acoustic wave resonator of the pair of shunt bulk acoustic wave resonators. The acoustic wave filter can include a capacitor in series with one shunt bulk acoustic wave resonator of the pair of shunt bulk acoustic wave resonators.

The acoustic wave filter can include a plurality of series bulk acoustic wave resonators coupled between the first pair of bulk acoustic wave resonators and the second pair of bulk acoustic wave resonators.

The acoustic wave filter can include a third pair of bulk acoustic wave resonators in anti-parallel with each other and a passive impedance element in series with one bulk acoustic wave resonator of the third pair, in which the third pair of bulk acoustic wave resonators is in series with the first pair of bulk acoustic wave resonators.

The first pair of bulk acoustic wave resonators can be in a first series filter stage of the acoustic wave filter form an antenna node. All other acoustic wave resonators of the acoustic wave filter can be coupled to an antenna node by way of the first pair of bulk acoustic wave resonators.

The acoustic wave filter can be a transmit filter.

The acoustic wave filter can be included in a multiplexer that includes at least one additional acoustic wave filter connected to the acoustic wave filter at a common node.

The acoustic wave filter can include a pair of shunt bulk acoustic wave resonators in anti-series with each other. The acoustic wave filter can include a second capacitor connected to a common electrode of the pair of shunt bulk acoustic wave resonators.

Another aspect of this disclosure is an acoustic wave filter with second harmonic emission suppression. The acoustic wave filter includes a first bulk acoustic wave resonator, a second bulk acoustic wave resonator in anti-parallel with the first bulk acoustic wave resonator, and a passive impedance element in series with the first bulk acoustic wave resonator. The passive impedance element is configured to cause to an imbalance in resonant frequency between the first and second bulk acoustic wave resonators to be reduced. The acoustic wave filter is configured to filter a radio frequency signal.

The passive impedance element can be a capacitor. The passive impedance element can be an inductor.

The first and second bulk acoustic wave resonators can be series resonators. The first and second bulk acoustic wave resonators can be included in a first series stage of the acoustic wave filter from an antenna node. The acoustic wave filter can be a transmit filter.

The first and second bulk acoustic wave resonators can be shunt resonators. The acoustic wave filter can be included in a multiplexer. The first and second bulk acoustic wave resonators can be included in a first shunt stage of the acoustic wave filter from a common node of the multiplexer. The acoustic wave filter can be a receive filter.

The acoustic wave filter can include a plurality of additional bulk acoustic wave resonators.

Another aspect of this disclosure is a multiplexer with second harmonic emission suppression. The multiplexer includes a first acoustic wave filter and a second acoustic wave filter coupled to the first acoustic wave filter at a common node. The first acoustic wave filter includes a first bulk acoustic wave resonator, a second bulk acoustic wave resonator in anti-parallel with the first bulk acoustic wave resonator, and a passive impedance element in series with the first bulk acoustic wave resonator. The passive impedance element is configured to cause to an imbalance in resonant frequency between the first and second bulk acoustic wave resonators to be reduced.

The passive impedance element can be a capacitor. The passive impedance element can be an inductor.

The first and second bulk acoustic wave resonators can be series resonators. The first acoustic wave filter can be a transmit filter. The first and second bulk acoustic wave resonators can be included in a first series stage of the first acoustic wave filter from the common node.

The first and second bulk acoustic wave resonators can be shunt resonators. The first acoustic wave filter can be a receive filter. The second acoustic wave filter can be a transmit filter. The first and second bulk acoustic wave resonators can be in a first shunt stage of the first acoustic wave filter from the common node.

Another aspect of this disclosure is a multiplexer that includes an acoustic wave filter in accordance with any suitable principles and advantages disclosed herein and a second filter connected to the acoustic wave filter at a common node.

Another aspect of this disclosure is a radio frequency module that includes an acoustic wave filter in accordance with any suitable principles and advantages disclosed herein, radio frequency circuitry, and a package structure enclosing the acoustic wave filter and the radio frequency circuitry.

Another aspect of this disclosure is a wireless communication device that includes a radio frequency front end including an acoustic wave filter in accordance with any suitable principles and advantages disclosed herein; and an antenna configured to transmit the radio frequency signal filtered by the acoustic wave filter.

Another aspect of this disclosure is a method of radio frequency signal processing with second harmonic emission suppression. The method includes amplifying a radio frequency signal and filtering the radio frequency signal with an acoustic wave filter in accordance with any suitable principles and advantages disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 18/511,781, titled "ACOUSTIC WAVE FILTER WITH SECOND HARMONIC EMISSION SUPPRESSION," filed on even date herewith, the entire disclosure of which is hereby incorporated by reference herein. The present disclosure relates to U.S. patent application Ser. No. 18/511,861, titled "BULK ACOUSTIC WAVE FILTER FOR SECOND HARMONIC RESIDUE REDUCTION," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

6 acoustic wave resonators with a balancing capacitor connected to a common electrode according to embodiments.

FIGS. 8A, 8B, 8C, and 8D are schematic diagrams of a series bulk acoustic wave resonator splits that include anti-parallel bulk acoustic wave resonators with a passive impedance element in series with one of the bulk acoustic wave resonators according to embodiments.

FIGS. 9A, 9B, 9C, and 9D are schematic diagrams of a shunt bulk acoustic wave resonator stage that includes anti-parallel bulk acoustic wave resonators with a passive impedance element in series with one of the bulk acoustic wave resonators according to embodiments.

Figure 10A:
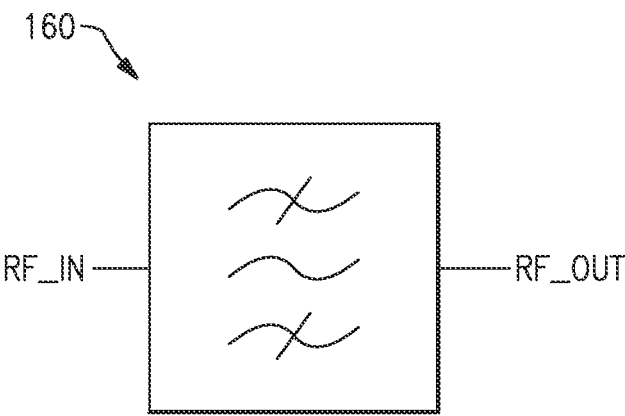
Figures 10B, 10C, 10D, 10E:
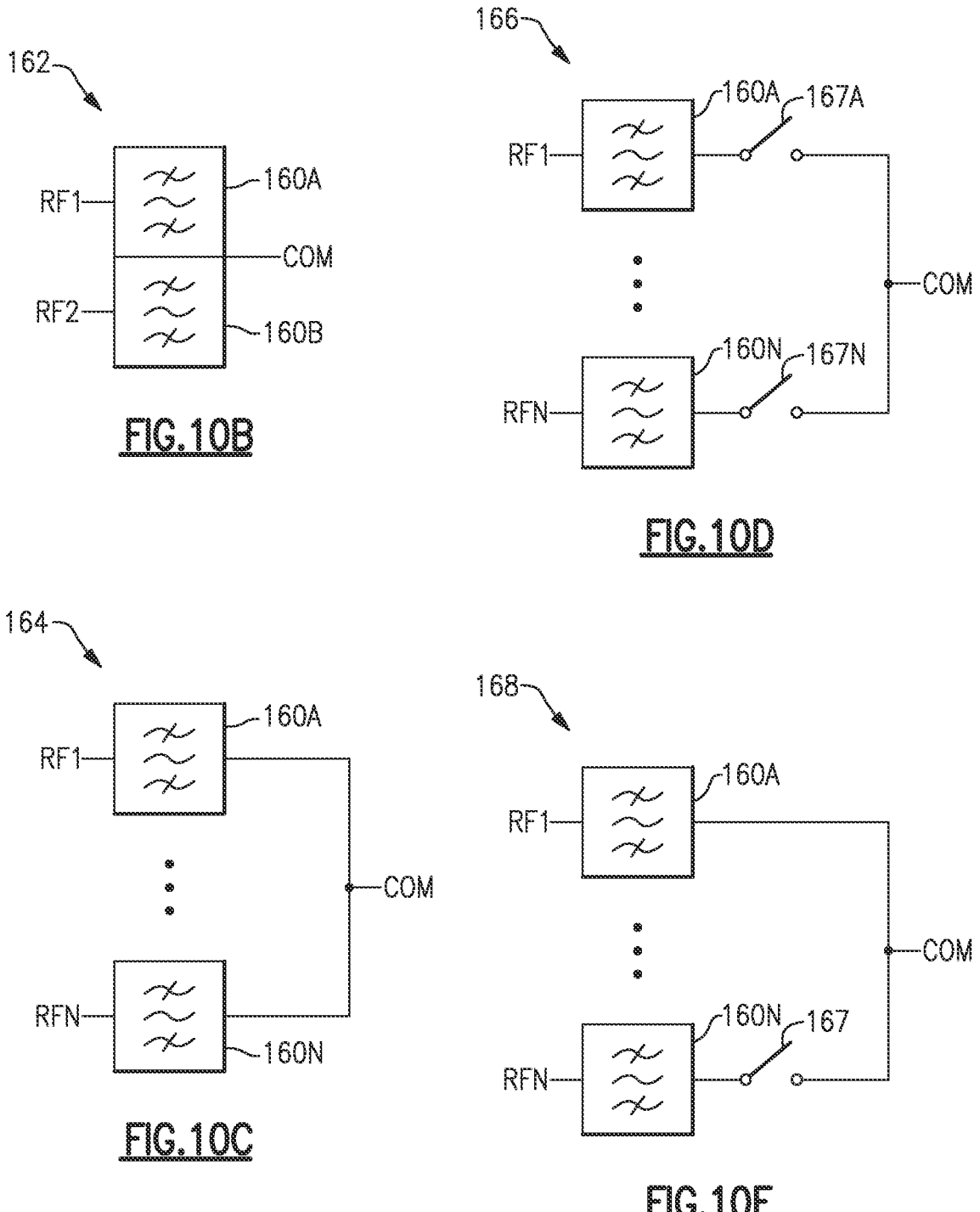

FIG. 10A is schematic diagram of an acoustic wave filter. FIG. 10B is a schematic diagram of a duplexer that includes an acoustic wave filter according to an embodiment. FIG. 10C is a schematic diagram of a multiplexer that includes an acoustic wave filter according to an embodiment. FIG. 10D is a schematic diagram of a multiplexer that includes an acoustic wave filter according to an embodiment. FIG. 10E is a schematic diagram of a multiplexer that includes an acoustic wave filter according to an embodiment.

Figure 11:
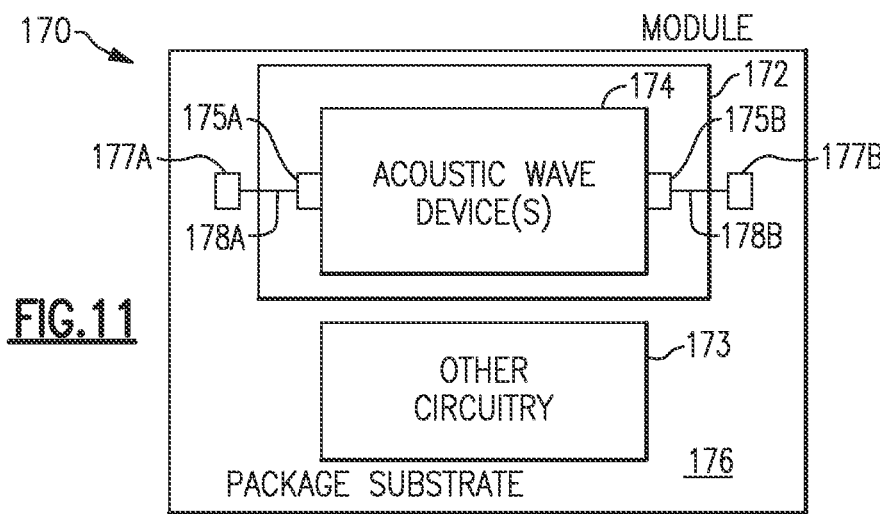
Figure 12:
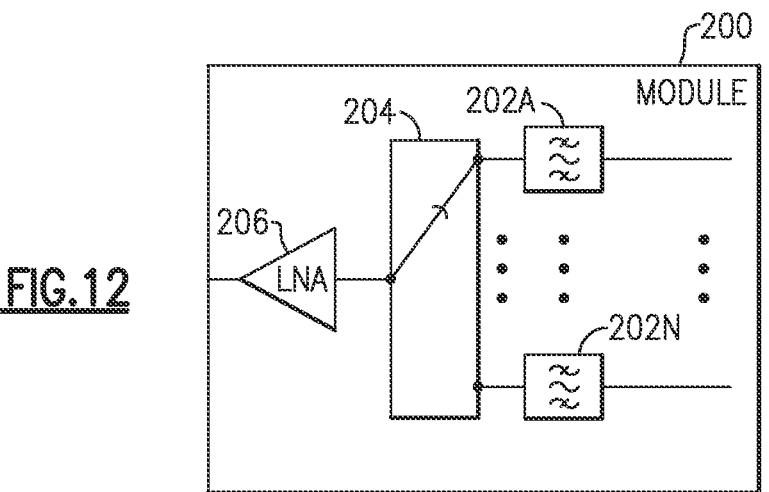
Figure 13:
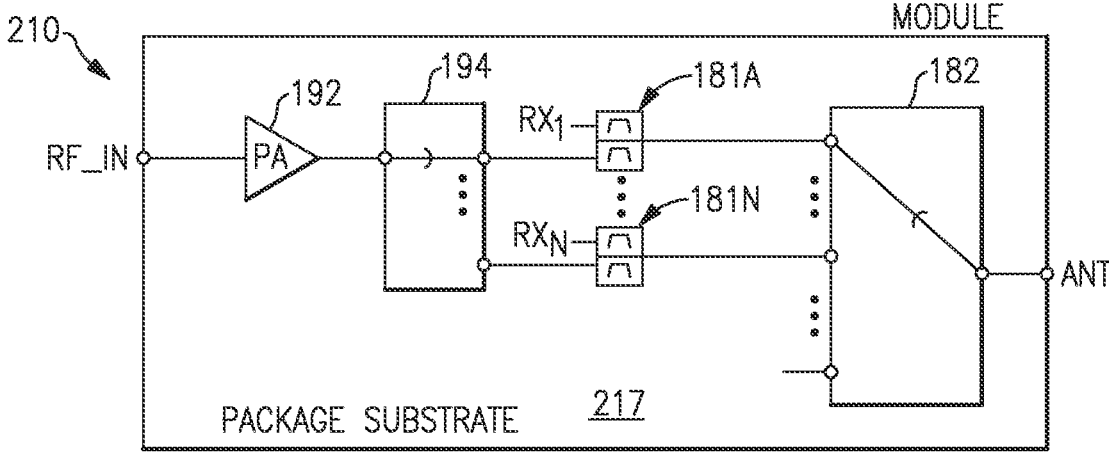

FIGS. 11, 12, and 13 are schematic block diagrams of illustrative packaged modules according to certain embodiments.

Figure 14:
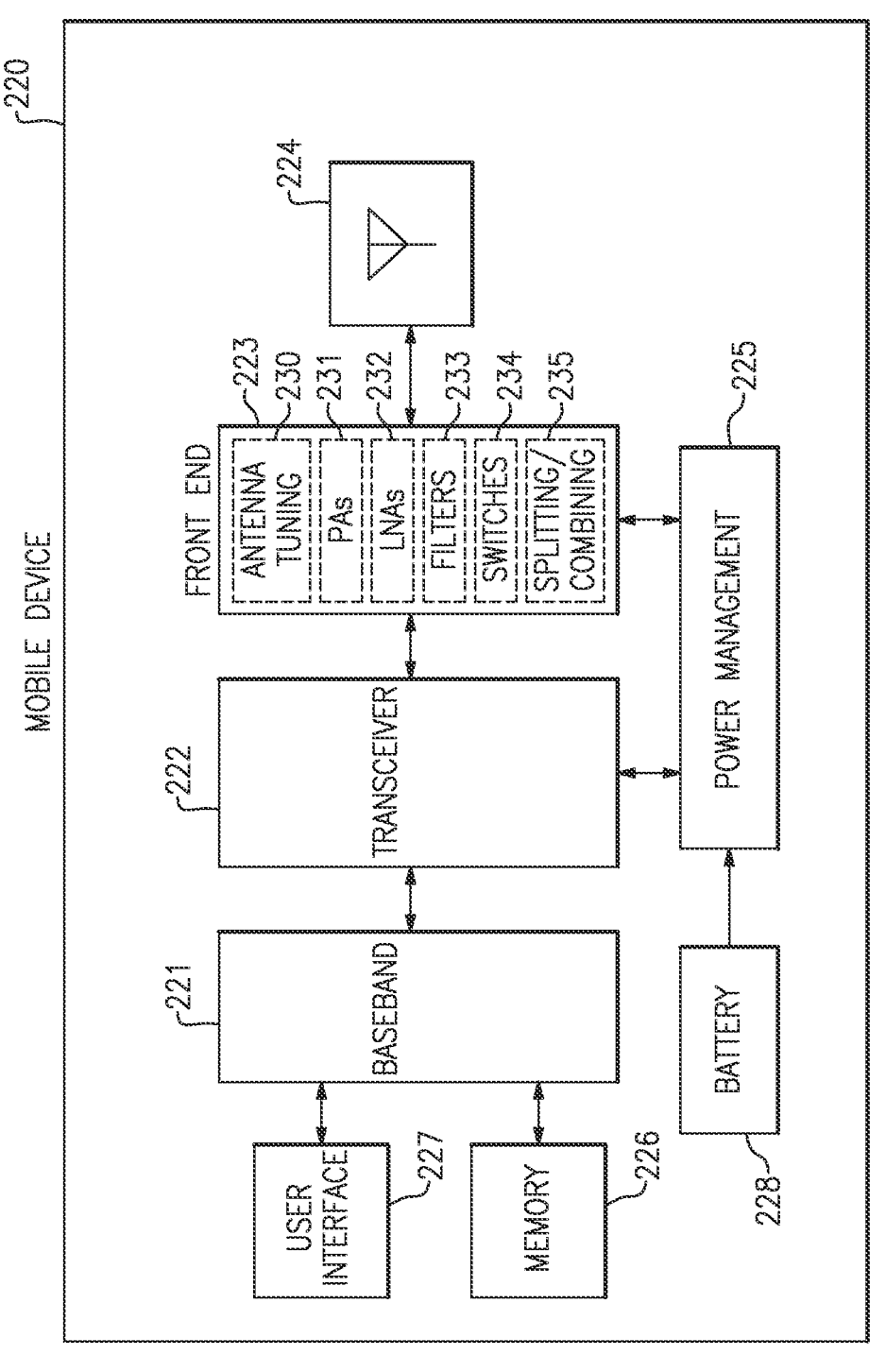

FIG. 14 is a schematic diagram of one embodiment of a mobile device.

Figure 15:
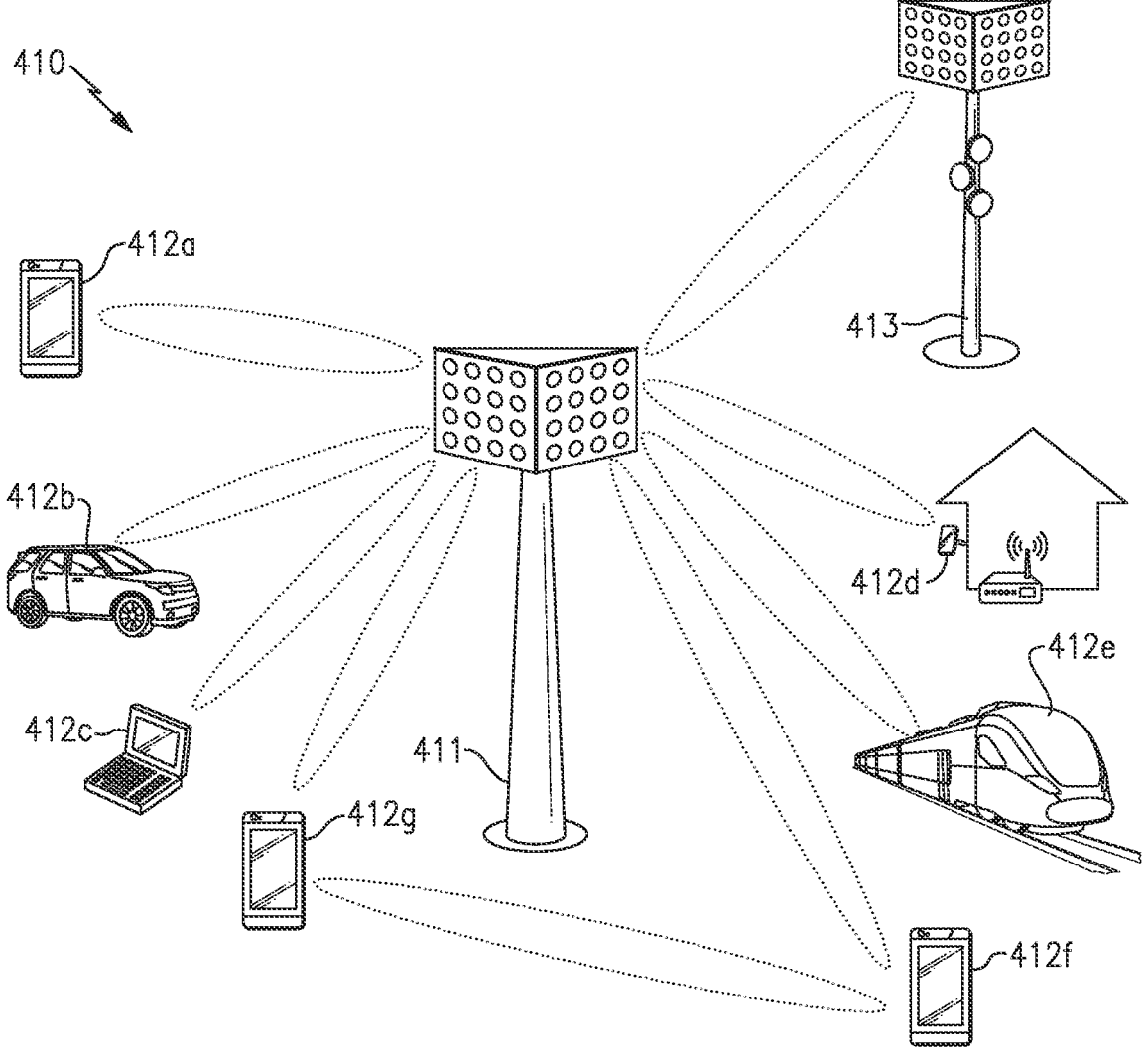

FIG. 15 is a schematic diagram of one example of a communication network.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Bulk acoustic wave (BAW) resonators can experience non-linearity with high power signals. For example, BAW resonators in transmit filters that filter high power transmit signals in applications related to wireless communications can experience non-linearity. Emission of harmonics is a technical challenge that can be caused by non-linearity.

Electrically connecting a pair of BAW resonators together in anti-series with each other can suppress second order harmonics. Anti-series BAW resonators are BAW resonators that are connected in series with each other with their polarities reversed. Such anti-series BAW resonator pairs with reversed electrode polarization can be implemented in place of a single series BAW resonator to suppress and/or cancel second harmonic power emissions (H2) generated by BAW resonators. However, even with anti-series BAW resonators, BAW filters can generate some undesirable H2. There are technical challenges with further reducing H2 generated by BAW filters.

Aspects of this disclosure relate to suppressing a non-linearity in BAW filters. The non-linearity can be H2. H2 suppression disclosed herein can provide higher rejection for H2 generated by BAW resonators than certain pervious H2 suppression techniques. Although embodiments may be discussed with reference to H2 suppression, any suitable principles and advantages disclosed herein can alternatively or additionally be applied to suppressing another non-linearity in an acoustic wave filter.

In one aspect, a first pair of BAW resonators in anti-series with each other is arranged in parallel with a second pair of BAW resonators in anti-series with each other, where the first pair of BAW resonators has reversed polarization relative to the second pair of BAW resonators. Such BAW resonator pairs can reduce and/or cancel H2 reside to implement second level H2 suppression. In this aspect, a balancing capacitor can be connected to a common electrode of one of the pairs of BAW resonators. The one of the pairs of BAW resonators can be selected for connecting to the balancing capacitor, for example, by simulation and/or testing. The balancing capacitor can be electrically connected between the common electrode of the pair of BAW resonators and ground (e.g., a grounded seal ring). The balancing capacitor can implement a third level H2 suppression. The capacitance of the balancing capacitor can be relatively small. Such a capacitance be determined by simulation and/or testing.

In another aspect, an acoustic wave filter with second harmonic emission suppression includes a first pair of BAW resonators in anti-series with each other in a filter stage and a second pair of BAW resonators in anti-series with each other in another filter stage, where second pair of BAW resonators have reverse electrode polarization relative to the first pair of BAW resonators. The first pair of BAW resonators can be is series with the second pair of BAW resonators. A balancing capacitor can be connected to a common electrode of the first pair of BAW resonators. Such an acoustic wave filter can provide desirable H2 suppression.

In another aspect, an acoustic wave filter includes a first BAW resonator, a second BAW resonator in anti-parallel with the first BAW resonator, and a passive impedance element in series with the first BAW resonator. The passive impedance element can cause an imbalance in resonant frequency between the first BAW resonator and the second BAW resonator to be reduced. This can suppress H2 generated by the acoustic wave filter. The passive impedance element can include a capacitor. The passive impedance element can include an inductor. The first and second BAW resonators can be in a series arm of an acoustic wave filter. The first and second BAW resonators can be in a shunt stage of an acoustic wave filter.

Figure 1C:
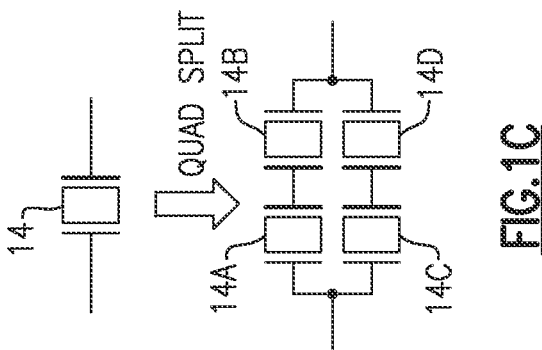
FIG. 1C is a schematic diagram of a bulk acoustic wave resonator implemented by two pairs of bulk acoustic wave resonators in parallel, where each pair of bulk acoustic wave resonators includes two bulk acoustic wave resonators in anti-series.
Figure 1B:
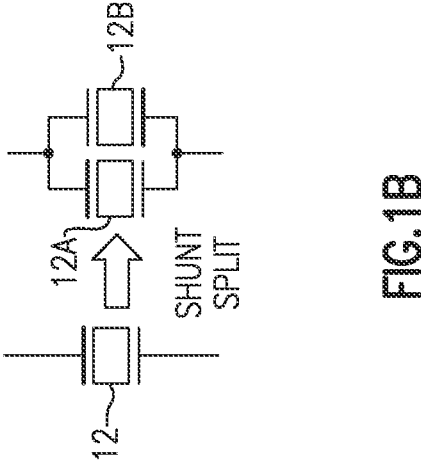
FIG. 1B is a schematic diagram of a shunt bulk acoustic wave resonator implemented by two bulk acoustic wave resonators in anti-parallel.
Figure 1A:
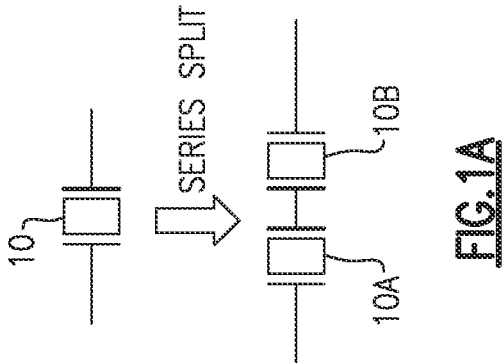
FIG. 1A is a schematic diagram of a series bulk acoustic wave resonator implemented by two bulk acoustic wave resonators in anti-series.

FIGS. 1A, 1B, and 1C are schematic diagrams that illustrate example BAW resonator splits. Splitting a BAW resonator into a plurality of BAW resonators can suppress H2 in an acoustic wave filter. For example, a series BAW resonator can be split into two anti-series BAW resonators. As another example, a shunt BAW resonator can be split into two anti-parallel BAW resonators. In some applications, a BAW resonator can be split into 4 BAW resonators. H2 cancellation by splitting a BAW resonator can be ideal in theory. However, due to electromagnetic (EM) coupling, there can be H2 residue left after such H2 suppression. The H2 residue can be due to physical layout. For example, parasitic capacitance mismatches in physical layout can lead to H2 residue.

In FIGS. 1A, 1B, 1C, and other drawings, a thicker line represents a top electrode of a BAW resonator and a thinner line represents a bottom electrode of the BAW resonator to show the resonator polarizations for BAW resonators. These drawings assume that the BAW resonators have a same piezoelectric layer c-axis orientation between the top electrode and bottom electrode. Two BAW resonators can have reversed electrode polarization at opposite electrodes (e.g., top electrode of one BAW resonator and bottom electrode of another BAW resonator) when the two BAW resonators have piezoelectric layers with a same c-axis orientation, for example, as shown in FIGS. 1A, 1B, and 1C. Alternatively, two BAW resonators can have reversed electrode polarization at the same electrodes (e.g., top electrode of one BAW resonator and top electrode of another BAW resonator) when the two BAW resonators have piezoelectric layers with opposite c-axis orientations. Accordingly, reverse electrode polarization can be implemented by flipping top and bottom electrodes or by reversing c-axis orientation. Any suitable principles and advantages disclosed herein related to reverse electrode polarization can be applied to any suitable reverse electrode polarization for BAW resonators.

FIG. 1A is a schematic diagram of a series BAW resonator 10 implemented by two BAW resonators 10A and 10B in anti-series with each other. As illustrated, the BAW resonators 10A and 10B are connected in series with their polarities reversed. The two BAW resonators 10A and 10B can have approximately double the area relative to an equivalent single BAW resonator 10. The anti-series resonators 10A and 10B can reduce H2 relative to implementing the single BAW resonator 10.

FIG. 1B is a schematic diagram of a shunt BAW resonator 12 implemented by two BAW resonators 12A and 12B in anti-parallel with each other. Anti-parallel BAW resonators are BAW resonators that are connected in parallel with each other with their polarities reversed. As illustrated, the BAW resonators 12A and 12B are connected in parallel with each other with their polarities reversed. The two BAW resonators 12A and 12B can have approximately half the area relative to an equivalent single BAW resonator 12. The anti-parallel resonators 12A and 12B can reduce H2 relative to implementing the single BAW resonator 12.

FIG. 1C is a schematic diagram of a BAW resonator 14 implemented by two pairs of BAW resonators in parallel, where each pair of BAW resonators includes two BAW resonators in anti-series with each other. FIG. 1C illustrates a quad resonator split. The BAW resonator 14 can be split into BAW resonators 14A, 14B, 14C, and 14D. The resonator size of the BAW resonators 14A, 14B, 14C, and 14D can be approximately the same as a single equivalent BAW resonator 14. A first pair of BAW resonators 14A and 14B are in anti-series with each other and in parallel with the second pair of BAW resonators 14C and 14D. The second pair of BAW resonators 14C and 14D are in anti-series with each other. Each pair of anti-series BAW resonators has the same polarization relative to each other in FIG. 1C.

Due to EM coupling, there can be H2 residue left behind after H2 cancellation in the resonator splits of FIGS. 1A, 1B, and 1C. Such H2 reside can have polarity. The polarity of the H2 residue can be used in further H2 cancellation. In a quad BAW resonator split, two anti-series pairs of BAW resonators that have reverse electrode polarities relative to each other can be arranged in parallel with each other. This can implement second order H2 cancellation.

Figure 2:
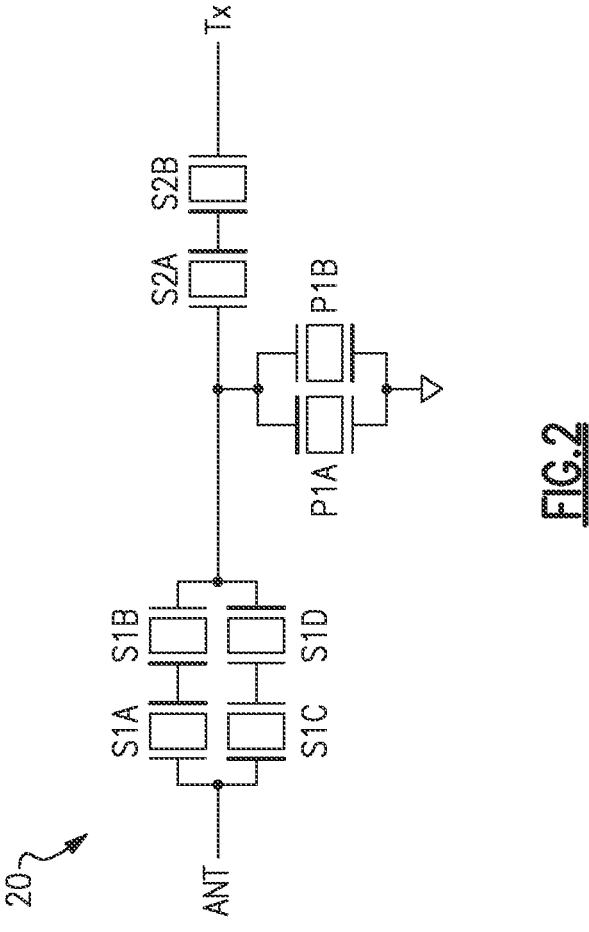
FIG. 2 is a schematic diagram of a bulk acoustic wave filter that includes series and shunt resonator splits.

FIG. 2 is a schematic diagram of a bulk acoustic wave filter 20 that includes series and shunt resonator splits. As illustrated, the BAW filter 20 is a transmit filter that includes a plurality of BAW resonators coupled between a transmit node Tx and an antenna node Ant. BAW resonators disclosed herein can include any suitable piezoelectric layer. For example, BAW resonators disclosed herein can have a piezoelectric layer that includes aluminum nitride (Al).

BAW resonators disclosed herein can be doped in certain applications. As one example, a BAW resonator can include a piezoelectric layer that includes aluminum nitride that is doped with scandium (Sc).

In a transmit filter, the first series stage from the antenna node Ant can have the largest contribution to H2 absent compensation. In the BAW filter 20, the first series filter stage from the antenna node Ant includes a quad resonator split to provide additional H2 cancellation relative to other series filter stage(s) and shunt filter stage(s).

The BAW filter 20 includes a first series stage from an antenna node Ant that includes a quad resonator split with four BAW resonators S1A, S1B, S1C, and S1D, a shunt stage with a pair of anti-parallel BAW resonators P1A and P1B, and a second series stage from the antenna node Ant that includes a pair of anti-series BAW resonators S2A and S2B. In the first series stage, a first pair of BAW resonators S1A and S1B are arranged in anti-series with each other and a second pair if BAW resonators S1C and S1D are arranged in anti-series with each other. The first pair of BAW resonators S1A and S1B has a reverse electrode polarization compared to the second pair of BAW resonators S1C and S1D. The first and second pairs of BAW resonators are arranged in parallel with each other. Arranging two anti-series pairs of BAW resonators with reverse electrode polarizations relative to each other in parallel can use the polarity of H2 residue for second order H2 cancellation.

Figure 3A:
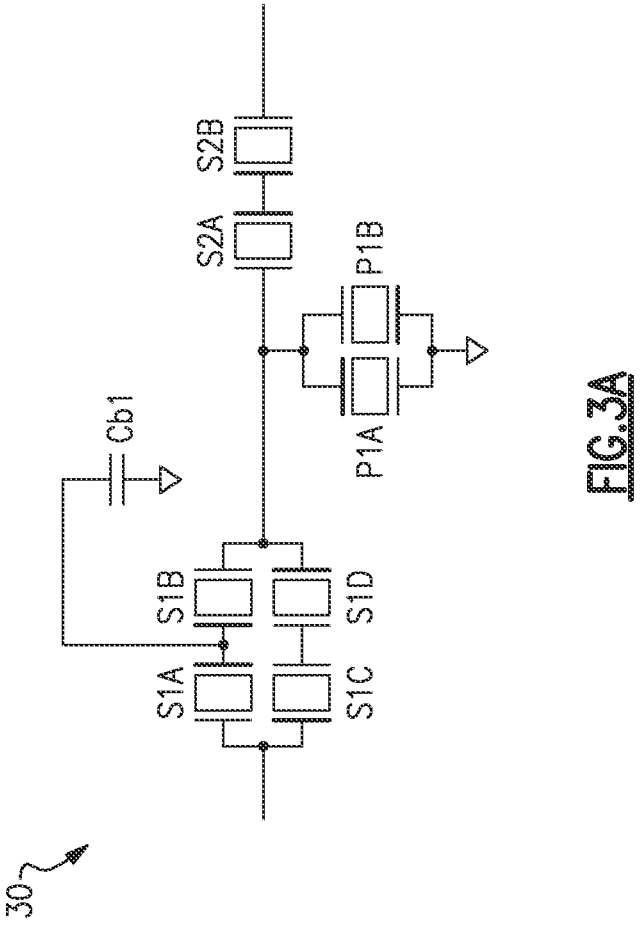
FIG. 3A is a schematic diagram of a bulk acoustic wave filter that includes a quad resonator split with a balancing capacitor according to an embodiment.

FIG. 3A is a schematic diagram of a bulk acoustic wave filter 30 that includes a quad resonator split with a balancing capacitor Cb1 according to an embodiment. The balancing capacitor Cb1 can be connected to a common electrode of a pair of anti-series BAW resonators in a first series stage from the antenna node Ant. The bulk acoustic wave filter 30 is like the bulk acoustic wave filter 20 of FIG. 2, except that the balancing capacitor Cb1 is connected to a common electrode of the first pair of BAW resonators S1A and S1B. The common electrode refers to the electrical connection at which the BAW resonators S1A and S1B are connected in anti-series with each other. The common electrode includes a top electrode of the BAW resonator S1A and a top electrode of the BAW resonator S1B in the FIG. 3A.

As illustrated in FIG. 3A, the balancing capacitor Cb1 is connected between the common electrode and ground. The balancing capacitor Cb1 can have a relatively small capacitance. The capacitance of the balancing capacitor Cb1 can be sufficient to compensate for a mismatch in parasitic capacitance between the common electrode for the first pair of BAW resonators S1A and S1B and the common electrode of the second pair of BAW resonators S1C and S1D. This mismatch in parasitic capacitance can be due to physical layout. Accordingly, the balancing capacitor Cb1 can compensate for H2 residue from physical layout. The balancing capacitor Cb1 can have a capacitance in a range from 0.03 picofarad (pF) to 0.2 pF, for example. The balancing capacitor Cb1 can be implemented in any suitable form. Examples of the balancing capacitor Cb1 will be discussed with reference to FIGS. 5A to 5D.

Figure 3B:
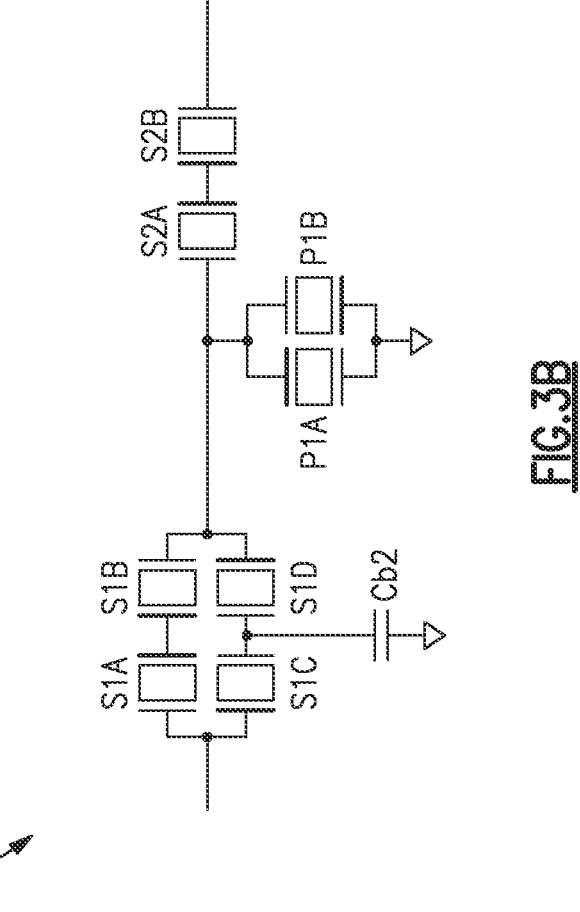
FIG. 3B is a schematic diagram of a bulk acoustic wave filter that includes a quad resonator split with a balancing capacitor according to an embodiment.

FIG. 3B is a schematic diagram of a bulk acoustic wave filter 32 that includes a quad resonator split with a balancing capacitor Cb2 according to an embodiment. The bulk acoustic wave filter 32 is like the bulk acoustic wave filter 30 of FIG. 3A, except that the balancing capacitor Cb2 is connected to a common electrode of the second pair of BAW resonators S1C and S1D instead of a balancing capacitor being electrically connected to the common electrode of the first pair of BAW resonators S1A and S1B. The balancing capacitor Cb2 can be implemented in accordance with any suitable principles and advantages discussed with reference to the balancing capacitor Cb1.

In certain applications, either the balancing capacitor Cb1 of FIG. 3A or the balancing capacitor Cb2 of FIG. 3B can be implemented. The balancing capacitor can be electrically connected to the common electrode of the pair of the anti-series BAW resonators of the quad resonator split of FIG. 2 that has lower capacitance. The capacitance of the balancing capacitor can reduce a difference in parasitic capacitance between the common electrodes of the anti-series pairs of BAW resonators for third order H3 cancellation. The determination of which pair of anti-series BAW resonators of a quad resonator split to connect the balancing capacitor can be determined by simulation, analysis of layout, or any other suitable method.

Figure 3C:
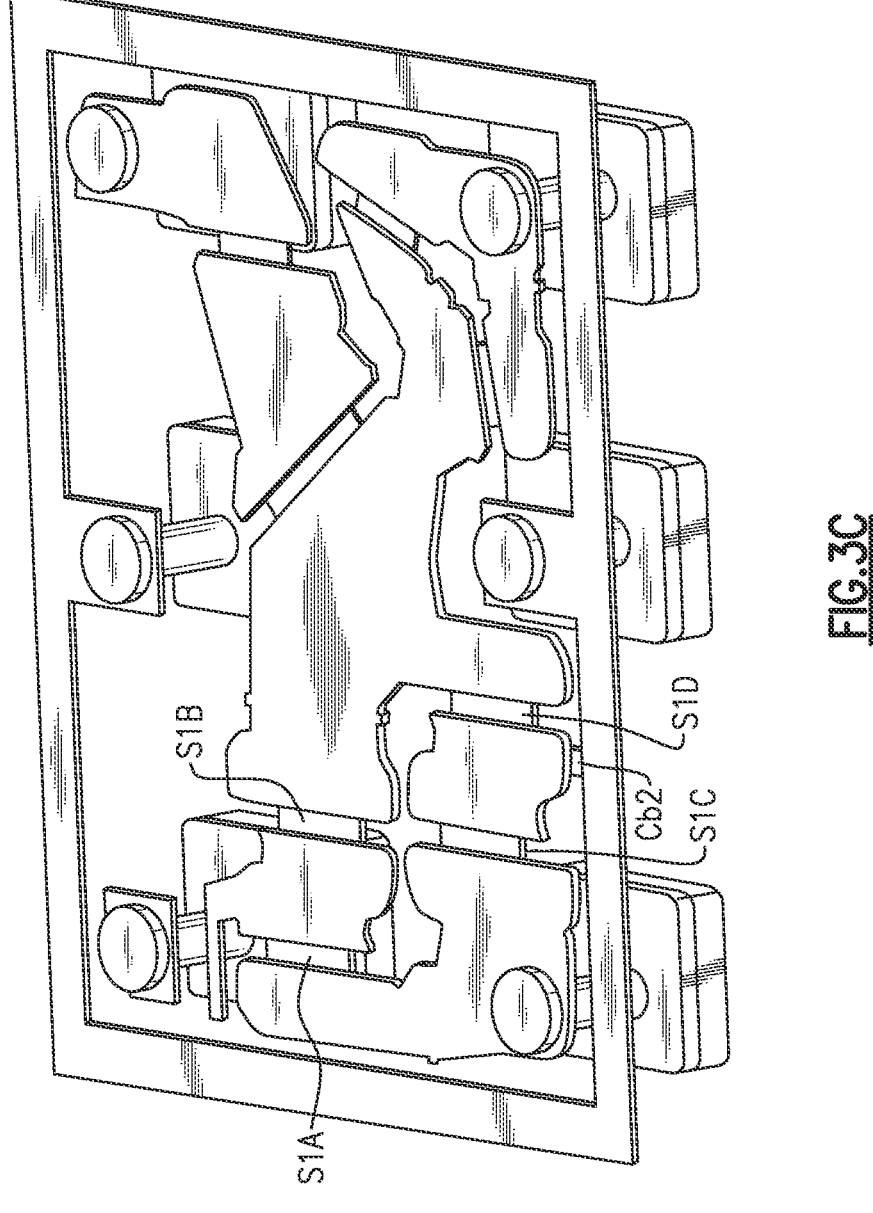
FIG. 3C is an example layout diagram of the bulk acoustic wave filter of FIG. 3B.

FIG. 3C is an example layout diagram of the bulk acoustic wave filter 32 of FIG. 3B. The balancing capacitor Cb2 can be connected between a common electrode of a pair of anti-series BAW resonators S1C and S1D and ground. In the illustrated layout, the balancing capacitor Cb2 is connected between the common electrode of the pair of anti-series BAW resonators S1C and S1D and a seal ring. The seal ring can be at a ground potential. The balancing capacitor Cb2 can be connected to any other suitable ground connection or potential in place of a seal ring. The balancing capacitor Cb2 can be implemented by any suitable type of capacitor, such as any of the capacitors of FIGS. 5A to 5D.

Figure 4:
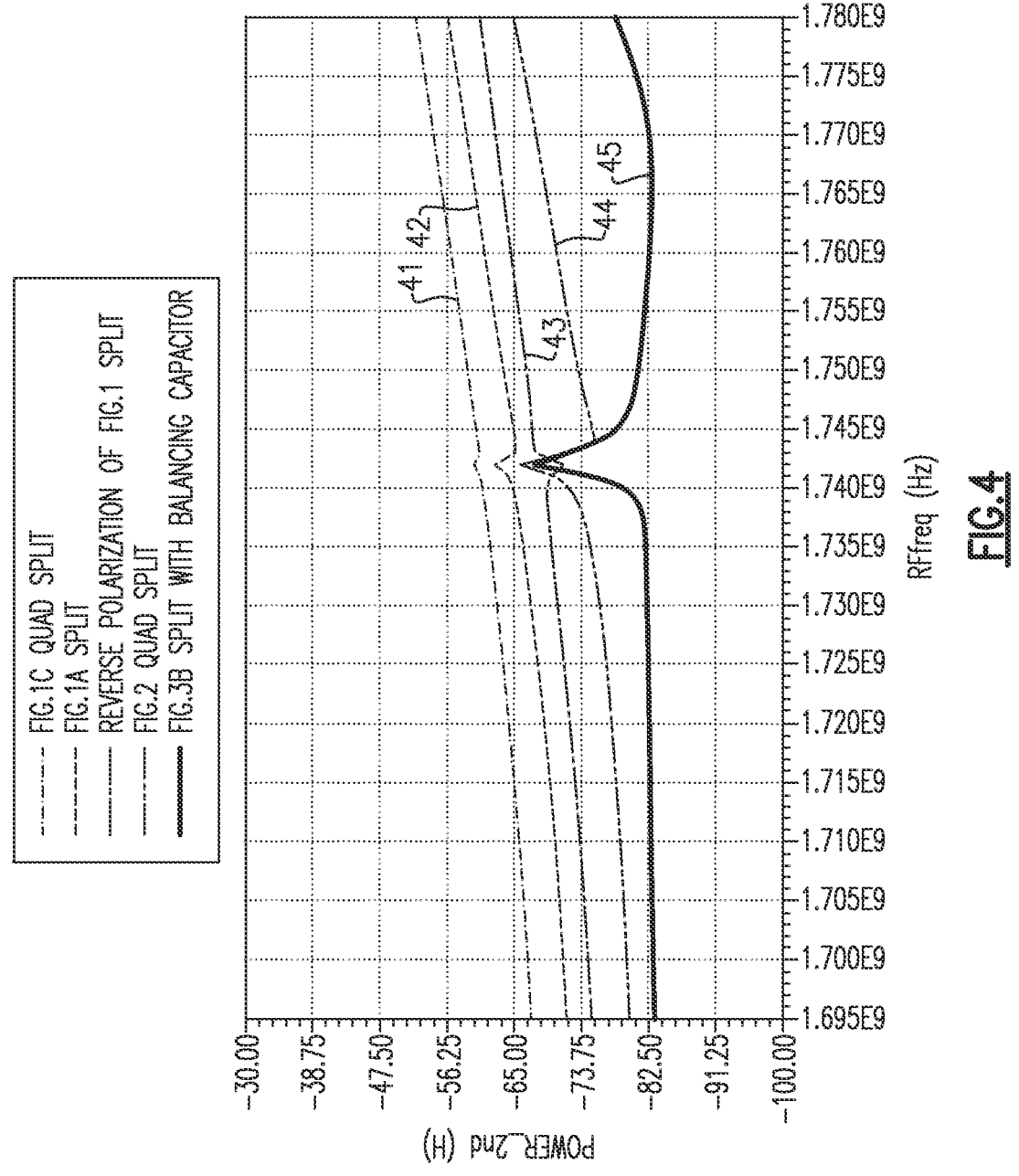
FIG. 4 is a graph with simulation results comparing second harmonic power emission (H2) for the filter of FIG. 3B to other similar filters.

FIG. 4 is a graph with simulation results comparing H2 for the filter of FIG. 3B to other similar filters. In the simulations, the non-linearity of acoustic wave resonators other than the first series BAW resonator stage from an antenna node is turned off. A first curve 41 corresponds to the first series BAW resonator stage being implemented by the BAW resonators 14A, 14B, 14C, and 14D arranged as shown in FIG. 1C. A second curve 42 corresponds to the first series BAW resonator stage being implemented by the BAW resonators 10A and 10B arranged as shown in FIG. 1A. A third curve 43 corresponds to the first series BAW resonator stage being implemented by the BAW resonators 10A and 10B each having polarity reverse relative to FIG. 1A. A fourth curve 44 corresponds to the first series BAW resonator stage being implemented by the BAW resonators S1A, S1B, S1C, and S1D arranged as shown in FIG. 2. A fifth curve 45 corresponds to the first series BAW resonator stage being implemented by the BAW resonators S1A, S1B, S1C, and S1D with a balancing capacitor Cb2 arranged as shown in FIG. 3B. FIG. 4 indicates improvement in H2 suppression for connecting two pairs of anti-series BAW resonators having reverse polarity relative to each other in parallel. FIG. 4 indicates additional improvement in H2 suppression with a balancing capacitor Cb2.

The balancing capacitors disclosed herein are implemented by capacitor structures rather than parasitic capacitances. FIGS. 5A, 5B, 5C, and 5D are schematic drawings of example balancing capacitors according to embodiments. Balancing capacitors disclosed herein can be implemented by any of these capacitors. Any of these balancing capacitors can be electrically connected between a common electrode of a pair of anti-series BAW resonators and ground. A balancing capacitor can be implemented by one or more of the capacitors of FIGS. 5A to 5D.

Figure 5D:
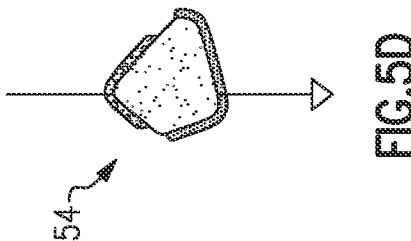
FIGS. 5A, 5B, 5C, and 5D are schematic drawings of example balancing capacitors according to embodiments.
Figure 5C:
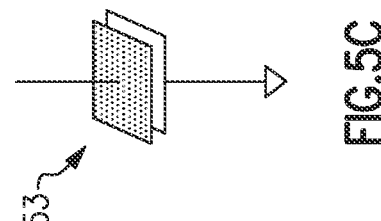
Figure 5B:
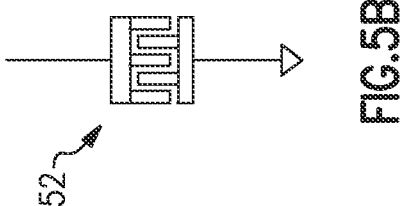
Figure 5A:
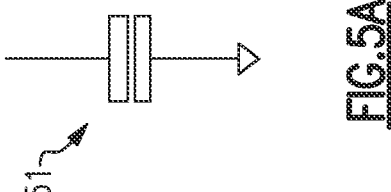

FIG. 5A illustrates a near metal capacitor 51. The near metal capacitor 51 can be implemented by two metal plates positioned relatively close to each other.

FIG. 5B illustrates an interdigital transducer (IDT) electrode capacitor 52. The IDT electrode capacitor 52 includes an IDT electrode, which can be implemented similar to an IDT electrode of a surface acoustic wave device.

FIG. 5C illustrates a metal-insulator-metal (MiM) capacitor 53. The MiM capacitor 53 can include two planar metal plates with an insulator positioned between the two planar metal plates. Such a capacitor can be referred to as a planar plates capacitor.

FIG. 5D illustrates a resonator capacitor 54. The resonator capacitor 54 can be implemented by an acoustic wave resonator, such as a BAW resonator. The resonator capacitor 54 can be an acoustic wave resonator implemented for its capacitive properties.

A balancing capacitor can be connected between a common electrode of a pair of anti-series connected BAW resonators and ground in any suitable filter stage. Two or more balancing capacitors can each be connected to respective common electrode of a pair of anti-series connected BAW resonators in an acoustic wave filter.

Figure 6:
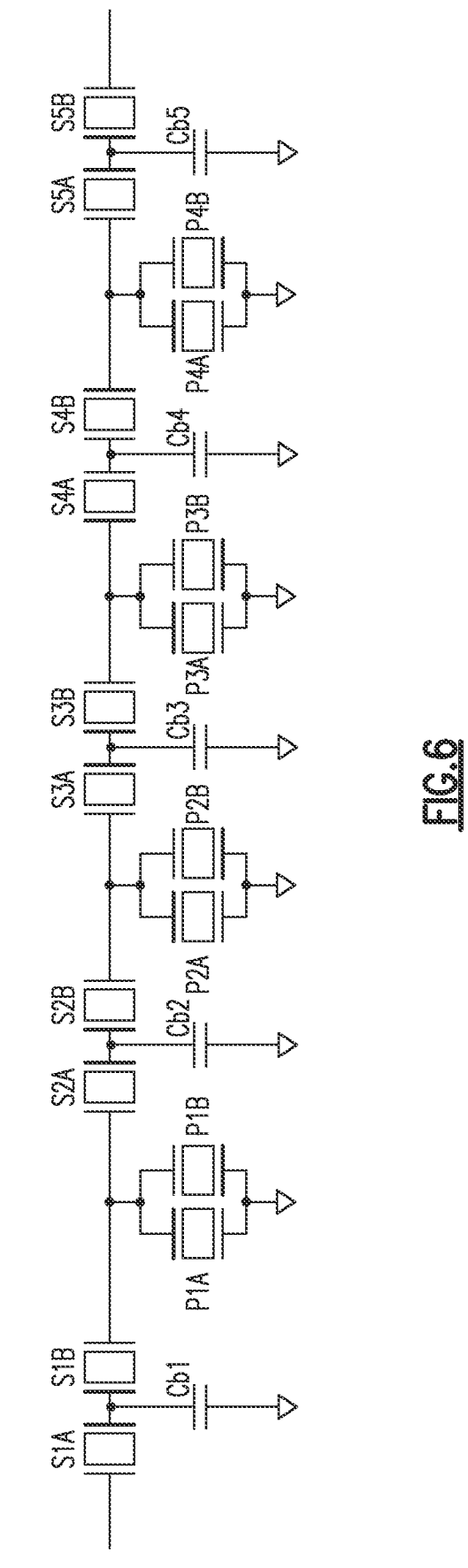
FIG. 6 is a schematic drawing of a bulk acoustic wave filter with H2 suppression according to an embodiment that includes revere polarization resonator splits and a balancing capacitor according to an embodiment.

FIG. 6 is a schematic drawing of a bulk acoustic wave filter 60 with H2 suppression according to an embodiment that includes revere polarization resonator splits and a balancing capacitor according to an embodiment. In the BAW filter 60, balancing capacitors Cb1, Cb2, Cb3, Cb4, and Cb5 are illustrated. One or more of these balancing capacitors can be implemented. The location of such one or more balancing capacitors can be determined by simulation and/or testing. In certain applications, less than all of the illustrated balancing capacitors Cb1, Cb2, Cb3, Cb4, and Cb5 are implemented with the resonator topology shown in FIG. 6. As many of the balancing capacitors Cb1, Cb2, Cb3, Cb4, and Cb5 can be implemented as desired to meet a specified level of H2 suppression.

The capacitance of a balancing capacitor Cb1, Cb2, Cb3, Cb4, and/or Cb5 can be determined by simulation and/or testing. The capacitance of a balancing capacitor Cb1, Cb2, Cb3, Cb4, or Cb5 can be relatively small. For example, such a capacitance can be in a range from 0.03 pF to 0.2 pF. The capacitance of a balancing capacitor Cb1, Cb2, Cb3, Cb4, or Cb5 can be smaller than capacitances of any of the individual BAW resonators of the BAW filter 60.

As shown in FIG. 6, a pair of anti-series BAW resonators S4A and S4B can have a reverse polarization relative to other pairs of anti-series BAW resonators S1A and S1B, S2A and S2B, S3A and S3B, S5A and S5B. Reversing polarization of at least one pair of anti-series BAW resonators relative to other pairs of anti-series BAW resonators can suppress H2 reside. Such a resonator topology can take advantage of the polarity of H2 reside. An anti-series BAW resonator pair to reverse electrode polarization can be determined based on simulation and/or analysis. The electrode polarization reversal of anti-series BAW resonators that provides the highest overall H2 cancellation can be selected. Each filter can have its own circuit parameters and physical layout. Accordingly, simulation and analysis on filter layer can determine which pair of anti-series BAW resonators to reverse electrode polarization relative to one or more other pairs of anti-series BAW resonators.

The illustrated filter 60 includes a pair of anti-series BAW resonators for each series filter stage. In some other applications, a subset of series filter stages includes a pair of anti-series BAW resonators. In such applications, there can be a first pair of anti-series BAW resonators and a second pair of anti-series resonators in different series filter stages, where the first and second pairs have reverse electrode polarizations relative to each other. In addition, one or more series filter stages can include a single series resonator and/or one or more series filter stages can include a pair of anti-parallel BAW resonators.

The illustrated BAW filter 60 includes a pair of anti-parallel BAW resonators P1A and P1B, P2A and P2B, P3A and P3B, P4A and P4B in each shunt filter stage. In some implementations a subset of shunt filter stages can include a pair of anti-parallel BAW resonators. In such implementations, one or more shunt filter stages can be implemented by a single acoustic wave resonator and/or one or more shunt filter stages can include a pair of anti-series BAW resonators.

Beyond anti-series BAW resonators for H2 cancellation, an acoustic wave filter can alternatively or additional include other BAW resonator splits. For instance, anti-parallel BAW resonators can be included in a shunt filter stage. An example of this is shown in FIG. 6. Other example resonator splits will be discussed with reference to FIGS. 7A to 9D. Any suitable principles and advantages of the resonator splits disclosed herein can be combined with each other in a filter and/or filter stage. For example, an acoustic wave filter can be implemented with two or more different resonator splits disclosed herein in different filter stages.

In certain applications, a series cascade can be implemented for a shunt resonator. For example, resonator size can be smaller than desired (e.g., for ruggedness in transmit applications) for implementing a parallel resonator split. Accordingly, a shunt filter stage can include anti-series BAW resonators.

Figure 7A:
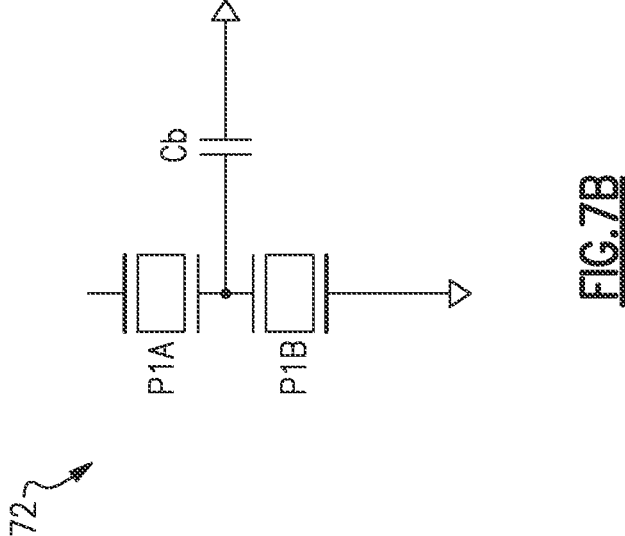
FIGS. 7A and 7B are schematic diagrams of a shunt bulk acoustic wave resonator split that includes anti-series bulk
Figure 7B:
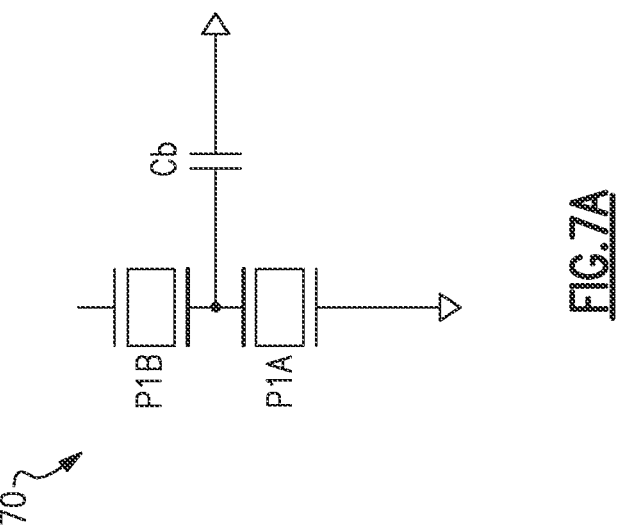

FIGS. 7A and 7B are schematic diagrams of shunt bulk acoustic wave resonator splits that include anti-series bulk acoustic wave resonators with a balancing capacitor connected to a common electrode according to embodiments. FIG. 7A illustrates a shunt filter stage 70 that includes a pair of anti-series BAW resonators P1A and P1B with a balancing capacitor Cb connected between a common electrode of the pair of anti-series BAW resonators P1A and P1B and ground. The balancing capacitor Cb to be included to reduce Fp imbalance between the BAW resonators P1A and P1B. Reducing this imbalance can reduce a H2 spike caused by an Fp imbalance. The balancing capacitor Cb can be implemented in accordance with any suitable principles and advantages of the balancing capacitors disclosed herein. The balancing capacitor Cb can be any suitable type of capacitor, such as any of the capacitors of FIGS. 5A to 5D. The balancing capacitor Cb can have a relatively small capacitance, such as a capacitance in a range from 0.03 pF to 0.2 pF. FIG. 7B illustrates a shunt filter stage 72 that is like the shunt filter stage 70, except that the electrode polarization of the anti-series BAW resonators is reversed and the balancing capacitor Cb is connected to an opposite polarity electrode in the shunt filter stage 72 relative to the shunt filter stage 70.

In some applications, splitting a series BAW resonator into a pair of anti-series BAW resonators would result in BAW resonators than are larger than desired. In such applications, a series BAW resonator can include a pair of anti-parallel BAW resonators.

FIGS. 8A, 8B, 8C, and 8D are schematic diagrams of series bulk acoustic wave resonator stages that include anti-parallel bulk acoustic wave resonators with a passive impedance element in series with one of the bulk acoustic wave resonators according to embodiments. Including a capacitor or inductor in series with one of the anti-parallel BAW resonators can reduce an Fs imbalance in the pair of anti-parallel BAW resonators of the series filter stage. Reducing the Fs imbalance can reduce in-band H2. Example embodiments of such an inductor or capacitor in combination with a pair of anti-parallel BAW resonators in a series filter stage are shown in FIGS. 8A to 8D. The filter stages of FIGS. 8A to 8D can be implemented in a transmit filter, for example.

Figures 8A, 8B, 8C, 8D:
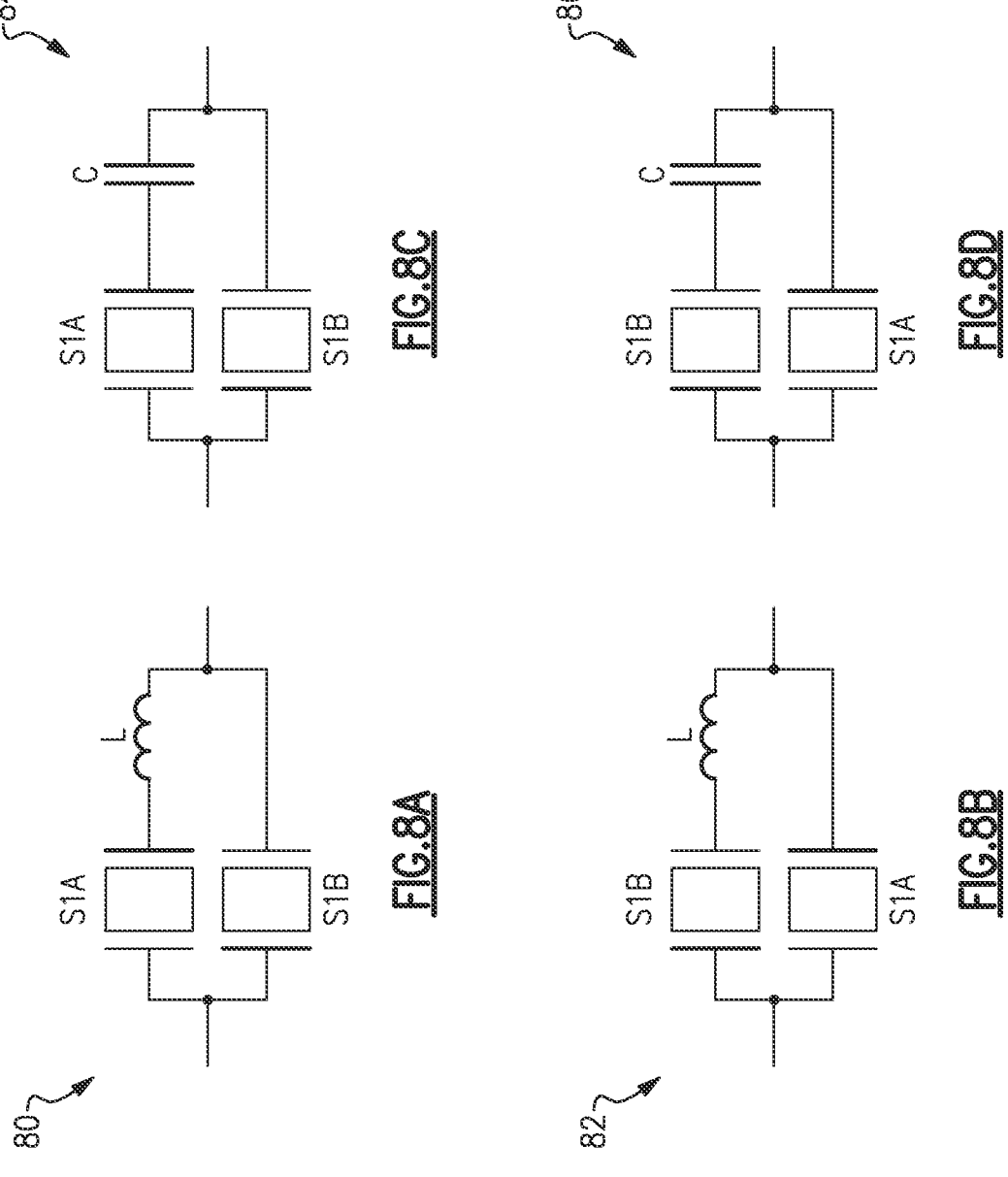

FIG. 8A illustrates a series filter stage 80 that includes anti-parallel BAW resonators S1A and S1B and an inductor L in series with the BAW resonator S1A. The inductor L can be any suitable type of inductor. For example, the inductor L can be a metal trace inductor. The inductor L can reduce an Fs imbalance between S1A and S1B.

FIG. 8B illustrates a series filter stage 82 that is like the series filter stage 80 of FIG. 8A, except that the inductor L is connected in series with the BAW resonator S1B having an opposite electrode polarization relative to the BAW resonator S1A. The inductor L is connected in series with opposite electrode polarizations of a BAW resonator in FIGS. 8A and 8B.

FIG. 8C illustrates a series filter stage 84 that includes anti-parallel BAW resonators S1A and S1B and a capacitor C in series with the BAW resonator S1A. The capacitor C can be any suitable type of capacitor. For example, the capacitor C can be any of the capacitors of FIGS. 5A to 5D. The capacitor C can reduce an Fs imbalance between S1A and S1B.

FIG. 8D illustrates a series filter stage 86 that is like the series filter stage 88 of FIG. 8C, except that the capacitor C is connected in series with the BAW resonator S1B having an opposite electrode polarization relative to the BAW resonator S1A. The capacitor C is connected in series with opposite electrode polarizations of a BAW resonator in FIGS. 8C and 8D.

Although either a capacitor or an inductor is in series with a BAW resonator in FIGS. 8A to 8D, a series combination or a parallel combination of a capacitor and an inductor can be in series with a BAW resonator in a series filter stage in some other applications.

For multiplexers, such as duplexers, a first shunt BAW resonator stage from an antenna node can be implemented by a pair of anti-parallel BAW resonators where one of the anti-parallel BAW resonators is in series with a passive impedance element, such as an inductor or a capacitor. Including an inductor or a capacitor in series with one of the shunt BAW resonators can reduce an Fs imbalance between the pair of anti-parallel BAW resonators. This can reduce a band edge H2 spike in another filter of the multiplexer. In certain applications, a receive filter of a multiplexer can include a pair of anti-parallel BAW resonators in a first shunt filter stage from an antenna mode where one of the anti-parallel BAW resonators is in series with a capacitor or an inductor. This can balance Fs in the anti-parallel BAW resonators, which can reduce a band edge H2 spike (e.g., higher band edge H2 spike) in a transmit filter of the multiplexer. The transmit filter and the receive filter can both associated with the same operating band.

FIGS. 9A, 9B, 9C, and 9D are schematic diagrams of a shunt bulk acoustic wave resonator filter stage that includes a pair of anti-parallel BAW resonators with a passive impedance element in series with one of the BAW resonators according to embodiments. The passive impedance element can be an inductor or a capacitor. The passive impedance element can reduce an Fs imbalance in the pair of anti-parallel BAW resonators of the shunt filter stage. Reducing the Fs imbalance can reduce an H2 spike at or near a band edge of another filter of a multiplexer. Example embodiments of such an inductor or capacitor in combination with a pair of anti-parallel BAW resonators in a shunt filter stage are shown in FIGS. 9A to 9D. The filter stages of FIGS. 9A to 9D can be implemented in a receive filter of a multiplexer, for example.

Figure 9A:
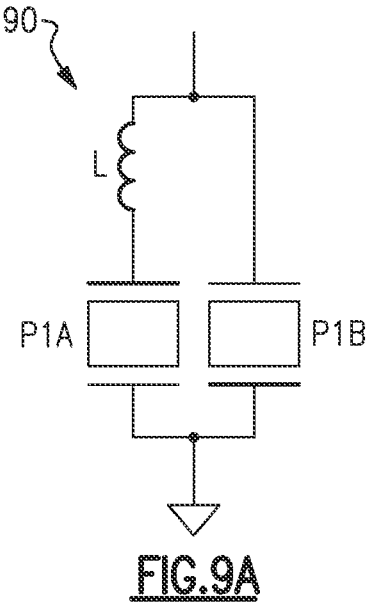

FIG. 9A illustrates a shunt filter stage 90 that includes anti-parallel BAW resonators P1A and P1B and an inductor L in series with the BAW resonator P1A. The inductor L can be any suitable type of inductor. For example, the inductor L can be a metal trace inductor. The inductor L can reduce an Fs imbalance between P1A and P1B.

Figure 9C:
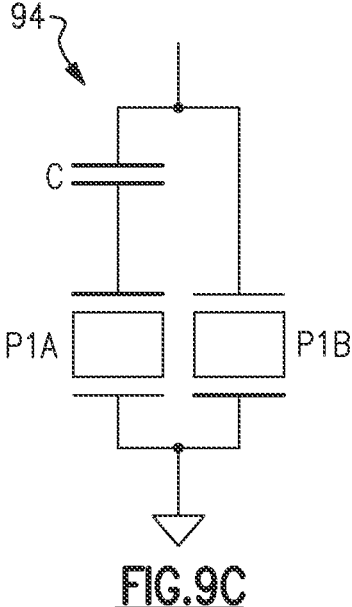
Figure 9B:
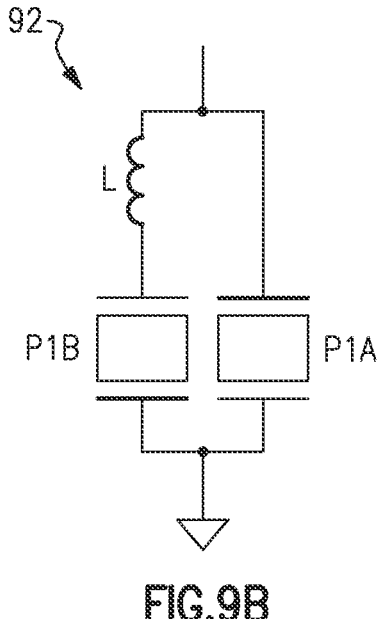

FIG. 9B illustrates a shunt filter stage 92 that is like the shunt filter stage 90 of FIG. 9A, except that the inductor L is connected in series with the BAW resonator P1B having an opposite electrode polarization relative to the BAW resonator P1A. The inductor L is connected in series with opposite electrode polarizations of a BAW resonator in FIGS. 9A and 9B.

FIG. 9C illustrates a shunt filter stage 94 that includes anti-parallel BAW resonators P1A and P1B and a capacitor C in series with the BAW resonator P1A. The capacitor C can be any suitable type of capacitor. For example, the capacitor C can be any of the capacitors of FIGS. 5A to 5D. The capacitor C can reduce an Fs imbalance between P1A and P1B.

Figure 9D:
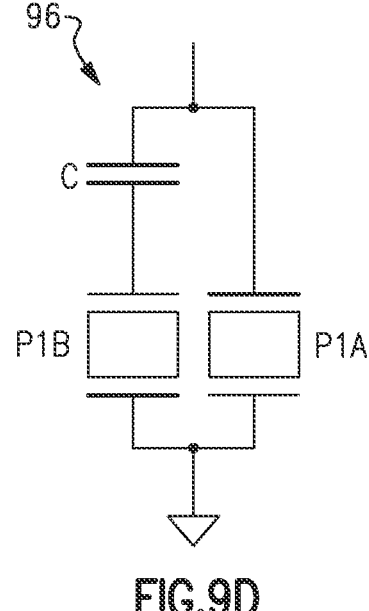

FIG. 9D illustrates a shunt filter stage 96 that is like the shunt filter stage 99 of FIG. 9C, except that the capacitor C is connected in series with the BAW resonator P1B having an opposite electrode polarization relative to the BAW resonator P1A. The capacitor C is connected in series with opposite electrode polarizations of a BAW resonator in FIGS. 9C and 9D.

Although either a capacitor or an inductor is in series with a BAW resonator in FIGS. 9A to 9D, a series combination or a parallel combination of a capacitor and an inductor can be in series with a BAW resonator in a shunt filter stage some other applications.

Embodiments disclosed herein include a passive impedance element, such as a capacitor or an inductor, connected to a BAW resonator. The passive impedance element can be connected to any suitable electrode, such as a top electrode or a bottom electrode of a BAW resonator. The electrode of the BAW resonator to which a passive impedance element is connected can depend on an imbalance being compensated for with the passive impedance element. In certain applications where an acoustic wave filter includes a plurality of passive impedance elements each connected to a different BAW resonator, the plurality of passive impedance elements can be connected to respective bottom electrodes of the BAW resonators. Such connections can be on a common z-axis.

Acoustic wave filters disclosed herein can be arranged to filter a radio frequency signal. In certain applications, the acoustic wave filters can be band pass filters arranged to pass a radio frequency band and attenuate frequencies outside of the radio frequency band. Acoustic wave filters can implement band rejection filters. The principles and advantages disclosed herein can be implemented in a variety of different filter topologies. Example filter topologies include a ladder filter, a lattice filter, and a hybrid ladder lattice filter, and the like. In some applications, bulk acoustic wave resonators disclosed herein can be included in filter that also includes one or more inductors and one or more capacitors. For example, bulk acoustic wave resonators disclosed herein can be implemented in a filter that also includes a non-acoustic inductor-capacitor component.

The principles and advantages disclosed herein can be implemented in a standalone filter and/or in one or more filters in any suitable multiplexer. Such filters can be any suitable topology. The filter can be a band pass filter arranged to filter a fourth generation (4G) Long Term Evolution (LTE) band and/or a fifth generation (5G) New Radio (NR) band. Any suitable principles and advantages disclosed herein can be implemented in a transmit filter. Any suitable principles and advantages disclosed herein can be implemented in a transmit filter. In some applications, two or more filters of a multiplexer can be implemented in accordance with any suitable principles and advantages disclosed herein. Examples of a standalone filter and multiplexers will be discussed with reference to FIGS. 10A to 10E. Any suitable principles and advantages of these filters and/or multiplexers can be implemented together with each other.

FIG. 10A is schematic diagram of an acoustic wave filter 160. The acoustic wave filter 160 can include acoustic wave resonators of an acoustic wave filter in accordance with any suitable principles and advantages disclosed herein. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF_OUT. The acoustic wave filter 160 includes H2 suppression according to an embodiment.

Embodiments disclosed herein can be implemented in a standalone filter and/or in a filter of any suitable multiplexer. Such filters can be any suitable topology, such as a ladder filter topology. The filter can be a band pass filter arranged to filter a 4G LTE band and/or 5G NR band. Example multiplexers will be discussed with reference to FIGS. 10B to 10E. Any suitable principles and advantages of these multiplexers can be implemented together with each other.

FIG. 10B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes H2 suppression in accordance with any suitable principles and advantages disclosed herein.

The second filter 160B can be any suitable filter arranged to filter a second radio frequency signal. The second filter 160B can be, for example, an acoustic wave filter, an acoustic wave filter that includes an acoustic wave resonator H2 suppression in accordance with any suitable principles and advantages disclosed herein, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of acoustic wave devices in accordance with any suitable principles and advantages disclosed herein.

FIG. 10C is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes an acoustic wave filter with H2 suppression in accordance with any suitable principles and advantages disclosed herein. The other filter(s) of the multiplexer 164 can include one or more acoustic wave filters, one or more acoustic wave filters with H2 suppression in accordance with any suitable principles and advantages disclosed herein, one or more LC filters, one or more hybrid acoustic wave LC filters, the like, or any suitable combination thereof.

FIG. 10D is a schematic diagram of a multiplexer 166 that includes an acoustic wave filter according to an embodiment. The multiplexer 166 is like the multiplexer 164 of FIG. 10C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filter 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

FIG. 10E is a schematic diagram of a multiplexer 168 that includes an acoustic wave filter according to an embodiment. The multiplexer 168 illustrates that a multiplexer can include any suitable combination of hard multiplexed and switched multiplexed filters. One or more acoustic wave filters in accordance with any suitable principles and advantages disclosed herein can be a filter (e.g., the filter 160A) that is hard multiplexed to the common node COM of the multiplexer 168. Alternatively or additionally, one or more acoustic wave filters in accordance with any suitable principles and advantages disclosed herein can be a filter (e.g., the filter 160N) that is switch multiplexed to the common node COM of the multiplexer 168.

Acoustic wave devices disclosed herein can be implemented in a variety of packaged modules. Some example packaged modules will now be disclosed in which any suitable principles and advantages of the acoustic wave devices disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 11 to 13 are schematic block diagrams of illustrative packaged modules according to certain embodiments. Any suitable combination of features of these packaged modules can be implemented with each other.

FIG. 11 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include an acoustic wave filter that includes a plurality of acoustic wave devices, for example. The acoustic wave devices can be BAW devices in certain applications.

The acoustic wave component 172 shown in FIG. 11 includes acoustic wave devices 174 and terminals 175A and 175B. The acoustic wave devices 174 can implement an acoustic wave filter in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 11. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be referred to as radio frequency circuitry in certain applications. The other circuitry 173 can be electrically connected to the acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

FIG. 12 is a schematic block diagram of a module 200 that includes filters 202A to 202N, a radio frequency switch 204, and a low noise amplifier 206 according to an embodiment.

One or more filters of the filters 202A to 202N can be implemented in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

FIG. 13 is a schematic diagram of a radio frequency module 210 that includes an acoustic wave filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 13 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can be an acoustic wave device in accordance with any suitable principles and advantages disclosed herein. Similarly, one or more of the receive filters can be an acoustic wave device in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

The acoustic wave filters disclosed herein can be implemented in wireless communication devices. FIG. 14 is a schematic block diagram of a wireless communication device 220 that includes an acoustic wave filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 14 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters in accordance with any suitable principles and advantages disclosed herein.

The front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 14, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 14, the power management system 225 receives a battery voltage from the battery 228. The battery 228 can be any suitable battery for use in the wireless communication device 220, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave filter including any suitable combination of features disclosed herein can be arranged to filter a radio frequency signal in a 5G NR operating band within Frequency Range 1 (FR1). FR1 can be from 410 MHz to 7.125 GHz, for example, as specified in a current 5G NR specification. An acoustic wave filter in accordance with any suitable principles and advantages disclosed herein can be arranged to filter a radio frequency signal in a fourth generation (4G) Long Term Evolution (LTE). An acoustic wave filter in accordance with any suitable principles and advantages disclosed herein can have a pass band that includes a 4G LTE operating band and a 5G NR operating band. Such a filter can be implemented in a dual connectivity application, such as an E-UTRAN New Radio-Dual Connectivity (ENDC) application.

Acoustic wave filters disclosed herein can suppress H2. Such features can be advantageous in 5G NR applications. Suppressing H2 can provide increased filter linearity. Higher filter linearity can contribute to meeting stringent system level linearity specifications in certain 5G NR applications. With higher filter linearity, higher peak to average power ratios that are present in certain 5G NR applications can be accommodated. Suppression of H2 and/or higher filter linearity can be advantageous for meeting one or more other specifications in 5G technology.

FIG. 15 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 411, the small cell base station 413, or UEs illustrated in FIG. 15 can implement one or more of the acoustic wave filters in accordance with any suitable principles and advantages disclosed herein. For example, one or more of the UEs shown in FIG. 15 can include one or more acoustic wave filters that include any suitable number of BAW resonators in accordance with any suitable principles and advantages disclosed herein.

Although specific examples of base stations and user equipment are illustrated in FIG. 15, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 15 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 15. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 15, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 GHz and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 15 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 400 MHz to 8.5 GHz or in FR1.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively.

While certain embodiments have been described, these embodiments have been presented by way of example only, and are not intended to limit the scope of the disclosure. Indeed, the novel acoustic filters described herein may be embodied in a variety of other forms. Furthermore, various omissions, substitutions, and changes in the form of the acoustic filters described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter comprising:
a first pair of bulk acoustic wave resonators in anti-series with each other in a filter stage; and
a second pair of bulk acoustic wave resonators in anti-series with each other in another filter stage, the second pair of bulk acoustic wave resonators having reverse electrode polarization relative to the first pair of bulk acoustic wave resonators, the first pair of bulk acoustic wave resonators being in series with the second pair of bulk acoustic wave resonators, and the acoustic wave filter configured to filter a radio frequency signal.

2. The acoustic wave filter of claim 1 further comprising a capacitor connected to a common electrode of the first pair of bulk acoustic wave resonators.

3. The acoustic wave filter of claim 2 wherein the capacitor has a capacitance in a range from 0.03 picofarad to 0.2 picofarad.

4. The acoustic wave filter of claim 2 further comprising a second capacitor connected to a common electrode of the second pair of bulk acoustic wave resonators.

5. The acoustic wave filter of claim 1 further comprising a third pair of bulk acoustic wave resonators in anti-series with each other, the first pair of bulk acoustic wave resonators being in series with the third pair of bulk acoustic wave resonators, and the first pair of bulk acoustic wave resonators and the third pair of bulk acoustic wave resonators having a common electrode polarization.

6. The acoustic wave filter of claim 1 further comprising a pair of shunt bulk acoustic wave resonators in anti-parallel with each other in a shunt filter stage.

7. The acoustic wave filter of claim 6 further comprising an inductor in series with one shunt bulk acoustic wave resonator of the pair of shunt bulk acoustic wave resonators.

8. The acoustic wave filter of claim 6 further comprising a capacitor in series with one shunt bulk acoustic wave resonator of the pair of shunt bulk acoustic wave resonators.

9. The acoustic wave filter of claim 1 further comprising a plurality of series bulk acoustic wave resonators coupled between the first pair of bulk acoustic wave resonators and the second pair of bulk acoustic wave resonators.

10. The acoustic wave filter of claim 1 further comprising a third pair of bulk acoustic wave resonators in anti-parallel with each other and a passive impedance element in series with one bulk acoustic wave resonator of the third pair, the third pair of bulk acoustic wave resonators in series with the first pair of bulk acoustic wave resonators.

11. The acoustic wave filter of claim 1 wherein the first pair of bulk acoustic wave resonators is in a first series filter stage of the acoustic wave filter from an antenna node.

12. The acoustic wave filter of claim 1 wherein all other acoustic wave resonators of the acoustic wave filter are coupled to an antenna node by way of the first pair of bulk acoustic wave resonators.

13. The acoustic wave filter of claim 1 wherein the acoustic wave filter is a transmit filter.

14. The acoustic wave filter of claim 1 further comprising a pair of shunt bulk acoustic wave resonators in anti-series with each other.

15. The acoustic wave filter of claim 14 further comprising a second capacitor connected to a common electrode of the pair of shunt bulk acoustic wave resonators.

16. A radio frequency module comprising:

an acoustic wave filter including a first pair of bulk acoustic wave resonators in anti-series with each other and a second pair of bulk acoustic wave resonators in anti-series with each other, the second pair of bulk acoustic wave resonators having reverse electrode polarization relative to the first pair of bulk acoustic wave resonators, and the first pair of bulk acoustic wave resonators being in series with and in a different filter stage than the second pair of bulk acoustic wave resonators;

radio frequency circuitry coupled to the acoustic wave filter; and a package structure enclosing the acoustic wave filter and the radio frequency circuitry.

17. The radio frequency module of claim 16 wherein the radio frequency circuitry includes a switch and a power amplifier.

18. The radio frequency module of claim 16 wherein the acoustic wave filter is included in a multiplexer, the multiplexer including a second filter connected to the acoustic wave filter at a common node.

19. A wireless communication device comprising:

a radio frequency front end including an acoustic wave filter configured to filter a radio frequency signal, the acoustic wave filter including a first pair of bulk acoustic wave resonators in anti-series with each other and a second pair of bulk acoustic wave resonators in anti-series with each other, the second pair of bulk acoustic wave resonators having reverse electrode polarization relative to the first pair of bulk acoustic wave resonators, and the first pair of bulk acoustic wave resonators being in series with and in a different filter stage than the second pair of bulk acoustic wave resonators; and an antenna configured to transmit the radio frequency signal.

20. The wireless communication device of claim 19 further comprising a baseband system and a transceiver, the transceiver in communication with the baseband system and the radio frequency front end.

* * * * *